US007468618B2

(12) United States Patent
Dybsetter et al.

(10) Patent No.: US 7,468,618 B2
(45) Date of Patent: Dec. 23, 2008

(54) MICROCODE-INITIATED HIGH SPEED COMPARATOR

(75) Inventors: Gerald L. Dybsetter, Scotts Valley, CA (US); Jayne C. Hahin, Cupertino, CA (US)

(73) Assignee: Finisar Corporation, Sunnyvale, CA (US)

( * ) Notice: Subject to any disclaimer, the term of this patent is extended or adjusted under 35 U.S.C. 154(b) by 552 days.

(21) Appl. No.: 11/172,295

(22) Filed: Jun. 30, 2005

(65) Prior Publication Data

US 2006/0001454 A1    Jan. 5, 2006

Related U.S. Application Data

(60) Provisional application No. 60/584,748, filed on Jun. 30, 2004.

(51) Int. Cl.
    *H03K 5/22* (2006.01)
(52) U.S. Cl. .......................... 327/63; 327/64
(58) Field of Classification Search .............. 327/63–90
    See application file for complete search history.

(56) References Cited

U.S. PATENT DOCUMENTS 4,214,213 A * 7/1980 Ferrie ........................ 327/77
5,295,132 A * 3/1994 Hashimoto et al. .......... 370/242
6,469,547 B1 * 10/2002 Rabii .......................... 327/74
2004/0022537 A1   2/2004 Mecherle et al.

* cited by examiner

Primary Examiner—Kenneth B Wells
Assistant Examiner—John W Poos
(74) Attorney, Agent, or Firm—Workman Nydegger

(57) ABSTRACT

A microcode-initiated high speed comparator in an optical transceiver includes an initialization and control section consisting of various register sets, an analog section with comparator hardware, and an output retrieval section. The comparator hardware performs comparison on a wide-range of selectable input values, thereby avoiding the need for a dedicated comparator for each input value. The register sets are initialized by microcode with various comparison values, allowing multiplexed comparison to be much faster than it would be if the processor was controlling in real-time the multiplexed comparison. The comparison values may correspond to optimal operational parameters of the optical transceiver or may correspond to other desired comparison values. The analog section is driven by the registers and makes a comparison between the predetermined values and actual operational parameter values.

19 Claims, 2 Drawing Sheets

MICROCODE-INITIATED HIGH SPEED COMPARATOR

CROSS-REFERENCE TO RELATED APPLICATIONS

This application claims the benefit of U.S. Provisional Application No. 60/584,748, filed Jun. 30, 2004, which is incorporated herein by reference in its entirety.

BACKGROUND OF THE INVENTION

1. The Field of the Invention

The present invention relates generally to high speed comparators. More specifically, the present invention relates to high speed comparators in an optical transceiver environment.

2. The Relevant Technology

Computing and networking technology have transformed our world. As the amount of information communicated over networks has increased, high speed transmission has become ever more critical. Many high speed data transmission networks rely on optical transceivers and similar devices for facilitating transmission and reception of digital data embodied in the form of optical signals over optical fibers. Optical networks are thus found in a wide variety of high speed applications ranging from as modest as a small Local Area Network (LAN) to as grandiose as the backbone of the Internet.

The operations of optical transmission devices in an optical network, such as an optical transceiver, are susceptible to their operating environment and to other operational parameters. Changes in operational parameters such as temperature or bias currents can have an effect on the output performance of the optical transmission device. To help monitor any operational parameter changes, the optical transmission device may be implemented with a comparator circuit.

A comparator circuit is used to make comparisons between actual operational parameter values and desired operational parameter values. For example, a comparator may take a measured operational temperature value and compare that with a desired operational temperature value. The result of the comparison may then be reported to other circuitry in the optical transmission device. If the comparison is outside of an acceptable range, then the optical transmission device may take appropriate action. Thus it can be seen that the speed of the comparator circuit is very important. The faster the comparator can produce a comparison result, the faster the optical transmission device can make any needed adjustments.

Many optical transmission devices require separate comparator hardware for every signal that comparisons are performed on. This often means that additional hardware such as multiple digital to analog converters are also needed. This additional hardware is costly and may slow down the speed of the comparator. In addition, many comparator circuits require real time control by a microprocessor while doing a comparison operation. Therefore, what would be advantageous is a high speed comparator that limits the amount of comparator hardware needed to perform comparisons and that operates without the need for real time control by a microprocessor.

BRIEF SUMMARY OF THE INVENTION

The forgoing problems with the prior state of the art are overcome by the principles of the present invention, which relate to a microcode-initiated high speed comparator. The microcode-initiated high speed comparator may be implemented in an optical transceiver or other like circuitry. The high speed comparator includes a comparator, a multiplexer, various multiplexer selection and comparison threshold registers, and an output retrieval register.

As mentioned, the high speed comparator contains multiplexer selection registers and comparison threshold registers. A source such as a microprocessor writes microcode data to the multiplexer selection and comparison threshold registers. The microcode data contains values that initialize the high speed comparator.

The multiplexer selection registers are coupled to the multiplexer. A selection node selects one register at a time to send its microcode-initialized value to the input of the multiplexer. This causes the multiplexer to send an analog value corresponding to the microcode-initialized value to one input of the comparator.

In like manner, the comparison threshold registers are coupled to the comparator. A selection node also selects one register at a time to send its microcode-initialized value to an input of the comparator different from the input the multiplexer sends a value to.

The comparator then compares the analog values provided by the multiplexer with the value provided by the comparison threshold register. The comparator then outputs the result of the comparison from an output node to a retrieval register. The result is held in the retrieval register for further use by the optical transceiver or other circuit implementing the high speed comparator.

Accordingly, the high speed comparator has many advantages. By initializing the registers with microcode values, it is possible to perform the comparison without the need for a microprocessor to control in real-time. This greatly adds to the speed of comparison. Additionally, by implementing a multiplexer and allowing for selection of an analog signal for comparison by the microcode-initialized value, a single comparator can be used for multiple analog values. This adds to the speed of the comparison while implementing less hardware, thus potentially reducing costs.

Additional features and advantages of the invention will be set forth in the description that follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

The principles of the present invention relate to a microcode-initiated high speed comparator in an optical transceiver system. The high speed comparator includes an initialization and control section consisting of various register sets, an analog section with comparator hardware, and an output retrieval section. The comparator hardware performs comparison on a wide-range of selectable input values, thereby avoiding the need for a dedicated comparator for each input value. In order to achieve high speed comparisons even in this multiplexed configuration, the register sets are initialized by microcode with various comparison values. The pre-initialization of these values allows the multiplexed comparison to be much faster than it would be if the processor was controlling in real-time the multiplexed comparison. The comparison values may correspond to optimal operational parameters of the optical transceiver or may correspond to other desired comparison values. The analog section is driven by the registers and makes a comparison between the predetermined values and actual operational parameter values. The result of the comparison is then sent to an output retrieval section where the comparison result can be retrieved for evaluation by sources external to the high speed comparator.

Figure 1:
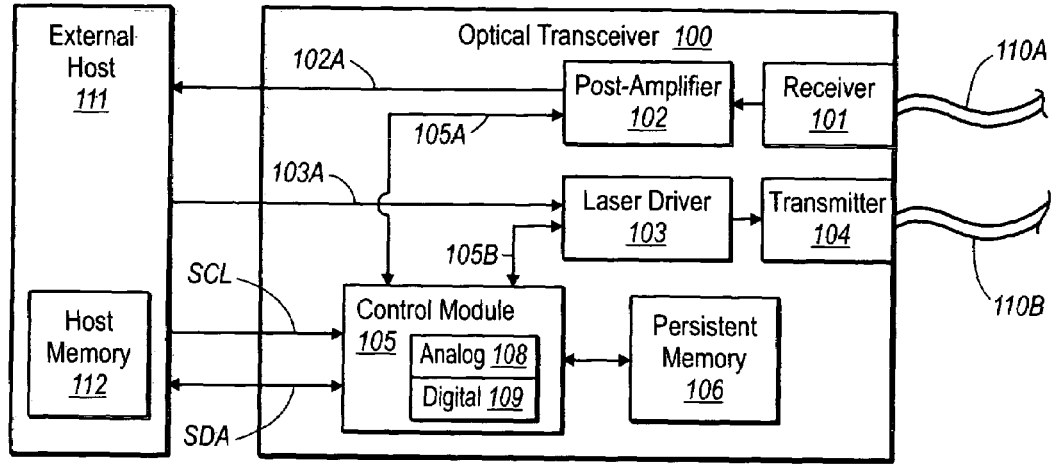
FIG. 1 schematically illustrates an example of an optical transceiver that may implement features of the present invention.

FIG. 1 illustrates an optical transceiver 100 in which the principles of the present invention may be employed. While the optical transceiver 100 will be described in some detail, the optical transceiver 100 is described by way of illustration only, and not by way of restricting the scope of the invention. The principles of the present invention are suitable for 1 G, 2 G, 4 G, 8 G, 10 G and higher bandwidth fiber optic links. Furthermore, the principles of the present invention may be implemented in optical (e.g., laser) transmitter/receivers of any form factor such as XFP, SFP and SFF, without restriction. Having said this, the principles of the present invention are not limited to an optical transceiver environment at all.

The optical transceiver 100 receives an optical signal from fiber 110A using receiver 101. The receiver 101 acts as an opto-electric transducer by transforming the optical signal into an electrical signal. The receiver 101 provides the resulting electrical signal to a post-amplifier 102. The post-amplifier 102 amplifies the signal and provides the amplified signal to an external host 111 as represented by arrow 102A. The external host 111 may be any computing system capable of communicating with the optical transceiver 100. The external host 111 may contain a host memory 112 that may be a volatile or non-volatile memory source. In one embodiment, the optical transceiver 100 may be a printed circuit board or other components/chips within the host 111, although this is not required.

The optical transceiver 100 may also receive electrical signals from the host 111 for transmission onto the fiber 110B. Specifically, the laser driver 103 receives the electrical signal as represented by the arrow 103A, and drives the transmitter 104 (e.g., a laser or Light Emitting Diode (LED)) with signals that cause the transmitter 104 to emit onto the fiber 110B optical signals representative of the information in the electrical signal provided by the host 111. Accordingly, the transmitter 104 serves as an electro-optic transducer.

The behavior of the receiver 101, the post-amplifier 102, the laser driver 103, and the transmitter 104 may vary dynamically due to a number of factors. For example, temperature changes, power fluctuations, and feedback conditions may each affect the performance of these components. Accordingly, the optical transceiver 100 includes a control module 105, which may evaluate temperature and voltage conditions and other operational circumstances, and receive information from the post-amplifier 102 (as represented by arrow 105A) and from the laser driver 103 (as represented by arrow 105B). This allows the control module 105 to optimize the dynamically varying performance, and additionally detect when there is a loss of signal.

Specifically, the control module 105 may counteract these changes by adjusting settings on the post-amplifier 102 and/or the laser driver 103 as also represented by the arrows 105A and 105B. These settings adjustments are quite intermittent since they are only made when temperature or voltage or other low frequency changes so warrant. Receive power is an example of such a low frequency change.

The control module 105 may have access to a persistent memory 106, which in one embodiment, is an Electrically Erasable and Programmable Read Only Memory (EEPROM). The persistent memory 106 and the control module 105 may be packaged together in the same package or in different packages without restriction. Persistent memory 106 may also be any other non-volatile memory source.

Figure 2:
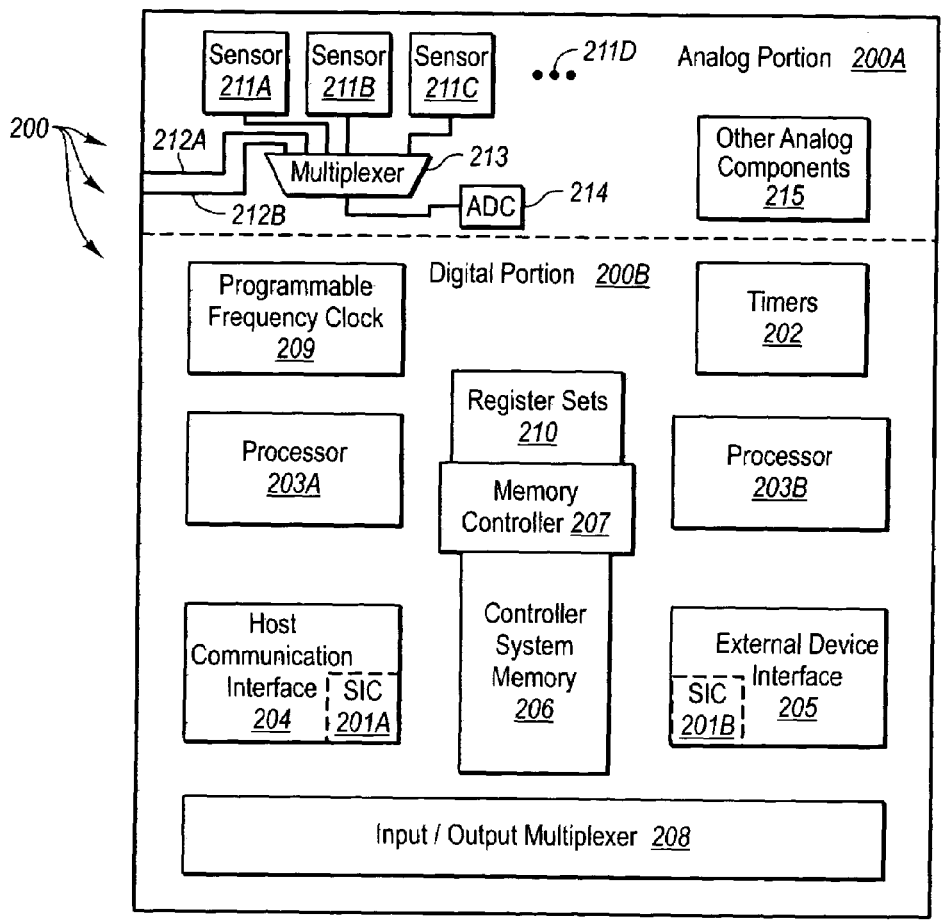
FIG. 2 schematically illustrates an example of a control module of FIG. 1.

The control module 105 includes both an analog portion 108 and a digital portion 109. Together, they allow the control module to implement logic digitally, while still largely interfacing with the rest of the optical transceiver 100 using analog signals. FIG. 2 schematically illustrates an example 200 of the control module 105 in further detail. The control module 200 includes an analog portion 200A that represents an example of the analog portion 108 of FIG. 1, and a digital portion 200B that represents an example of the digital portion 109 of FIG. 1.

For example, the analog portion 200A may contain digital to analog converters, analog to digital converters, high speed comparators (e.g., for event detection), voltage based reset generators, voltage regulators, voltage references, clock generator, and other analog components. For example, the analog portion 200A includes sensors 211A, 211B, 211C amongst potentially others as represented by the horizontal ellipses 211D. Each of these sensors may be responsible for measuring operational parameters that may be measured from the control module 200 such as, for example, supply voltage and transceiver temperature. The control module may also receive external analog or digital signals from other components within the optical transceiver that indicate other measured parameters such as, for example, laser bias current, transmit power, receive power, laser wavelength, laser temperature, and Thermo Electric Cooler (TEC) current. Two external lines 212A and 212B are illustrated for receiving such external analog signals although there may be many of such lines.

The internal sensors may generate analog signals that represent the measured values. In addition, the externally provided signals may also be analog signals. In this case, the analog signals are converted to digital signals so as to be available to the digital portion 200B of the control module 200 for further processing. Of course, each analog parameter value may have its own Analog to Digital Converter (ADC). However, to preserve chip space, each signal may be periodically sampled in a round robin fashion using a single ADC such as the illustrated ADC 214. In this case, each analog value may be provided to a multiplexer 213, which selects in a round robin fashion, one of the analog signals at a time for sampling by the ADC 214. Alternatively, multiplexer 213 may be programmed to allow any order of analog signals to be sampled by ADC 214.

As previously mentioned, the analog portion 200A of the control module 200 may also include other analog components 215 such as, for example, digital to analog converters, other analog to digital converters, high speed comparators (e.g., for event detection), voltage based reset generators, voltage regulators, voltage references, clock generator, and other analog components. The digital portion 200B of the control module 200 may include a timer module 202 that provides various timing signals used by the digital portion 200B. Such timing signals may include, for example, programmable processor clock signals. The timer module 202 may also act as a watchdog timer.

Two general-purpose processors 203A and 203B are also included. The processors recognize instructions that follow a particular instruction set, and may perform normal general-purpose operation such as shifting, branching, adding, subtracting, multiplying, dividing, Boolean operations, comparison operations, and the like. In one embodiment, the general-purpose processors 203A and 203B are each a 16-bit processor and may be identically structured. The precise structure of the instruction set is not important to the principles of the present invention as the instruction set may be optimized around a particular hardware environment, and as the precise hardware environment is not important to the principles of the present invention.

A host communications interface 204 is used to communicate with the host 111, possibly implemented using a two-wire interface such as I²C shown in FIG. 1 as the serial data (SDA) and serial clock (SCL) lines on the optical transceiver 100. Other host communication interfaces may also be implemented as well. Data may be provided from the control module 105 to the host 111 using this host communications interface to allow for digital diagnostics and readings of temperature levels, transmit/receiver power levels, and the like. The external device interface 205 is used to communicate with, for example, other modules within the optical transceiver 100 such as, for example, the post-amplifier 102, the laser driver 103, or the persistent memory 106.

The internal controller system memory 206 (not to be confused with the external persistent memory 106) may be Random Access Memory (RAM) or non-volatile memory. The memory controller 207 shares access to the controller system memory 206 amongst each of the processors 203A and 203B and with the host communication interface 204 and the external device interface 205. In one embodiment, the host communication interface 204 includes a serial interface controller 201A, and the external device interface 205 includes a serial interface controller 201B. The two serial interface controllers 201A and 201B may communicate using a two-wire interface such as I²C or may be another interface so long as the interface is recognized by both communicating modules. One serial interface controller (e.g., serial interface controller 201B) is a master component, while the other serial interface controller (e.g., serial interface controller 201A) is a slave component.

An input/output multiplexer 208 multiplexes the various input/output pins of the control module 200 to the various components within the control module 200. This enables different components to dynamically assign pins in accordance with the then-existing operational circumstances of the control module 200. Accordingly, there may be more input\output nodes within the control module 200 than there are pins available on the control module 200, thereby reducing the footprint of the control module 200.

A programmable frequency clock 209 is used to control the clock speed in the optical transceiver high speed comparator. As will be described in further below with respect to FIG. 3, the programmable frequency clock 209 may change in operational frequency depending on data within a memory location. The data may be generated by executing microcode that causes the processors 203 to populate the memory location. Accordingly, the frequency of the clock 209 may be varied as appropriate.

Register sets 210 contain a number of individual registers. These registers may be used by the processors 203 to write microcode generated data that controls high speed comparison in optical transceiver 100. For example, the registers may contain ideal transceiver 100 operational parameter values for comparison with actual operational parameters. Alternatively, the registers may hold data selecting operational parameters for comparison.

Having described a specific environment with respect to FIGS. 1 and 2, it will be understood that this specific environment is only one of countless architectures in which the principles of the present invention may be employed. As previously stated, the principles of the present invention are not intended to be limited to any particular environment. The principles of the present invention will be discussed with reference to the environment described in relation to FIGS. 1 and 2.

Figure 3:
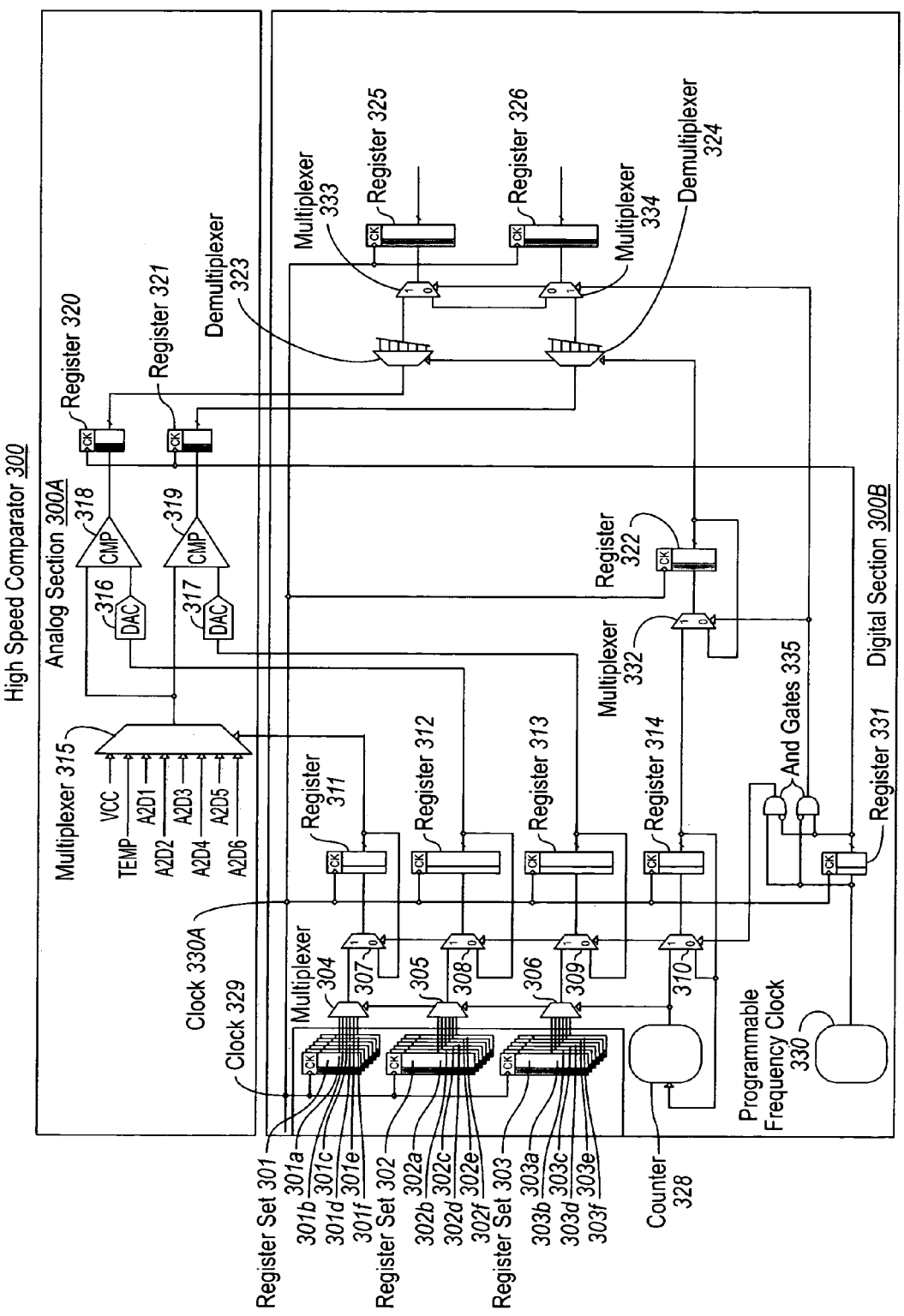
FIG. 3 schematically illustrates an embodiment of a high speed comparator in which the principles of the present invention may be practiced.

FIG. 3 illustrates a microcode-initiated high speed comparator 300, including an analog portion 300A and a digital portion 300B, in which the principles of the present invention may be employed. High speed comparator 300 may correspond to a comparator contained within the other analog components 215 of control module 200 as shown in FIG. 2. While the microcode-initiated high speed comparator 300 will be described in some detail, the microcode-initiated high speed comparator 300 is described by way of illustration only, and not by way of restricting the scope of the invention. The principles of the present invention allow for high speed comparison even while performing multiplexed comparison. This is important as the comparison must be made at high speeds, leaving no time for a system microprocessor to initiate the multiplexed comparison. In addition, although the present invention is implemented in an optical transceiver, the principles of the present invention are not limited to an optical transceiver environment at all.

The digital section 300B contains three register sets 301, 302, and 303, which in some embodiments correspond to individual register sets in register sets 210 described above with respect to FIG. 2. Each register set may contain any number of individual registers. In this description and in the claims, a "register" is defined as any memory location whether a discrete component (e.g., a processor register) or integrated with additional memory (e.g., Random Access Memory). Register sets 301, 302, and 303 are capable of receiving microcode-initialized data from a source that is external to the high speed comparator 300. For example, in some embodiments processors 203A and 203B of FIG. 2 may be used to load microcode containing selection and comparison data into register sets 301, 302, and 303.

The pre-initialized data provides the appropriate operational parameters to the comparator at the appropriate time as will be explained further below. For example, if six operational parameters were to be compared, then the microcode would pre-load the values of the parameters into register sets 301, 302, and 303, with each set of registers containing six individual registers. The loaded parameters need not be exclusive of one another as it is possible to select the same parameter for all comparisons. For example, a parameter such as temperature could be selected all six times for comparison. By pre-selecting the parameters to compare and loading them into register sets 301, 302, and 303, it not necessary to use any system microprocessor to select in real-time the desired parameters during comparison. Thus the microcode initiates the high speed comparison.

Multiplexer selection register set 301 may contain individual registers 301a, 301b, 301c, etc. as desired. Registers 301a, 301b, 301c, etc may be three bit registers containing control values that select which analog signal at an input of multiplexer 315 will be compared. For example, if register 301a was configured to select the first analog signal, seen in FIG. 3 as VCC, then register 301a would contain 000 in binary. In like manner, registers 301b, 301c, etc. would contain binary numbers corresponding to additional analog signals. For example, a 001 binary value in a register would be used to select the TEMP signal for multiplexing. Similarly, 010 may select the A2D1 value, 011 may select the A2D2 value, 100 may select the A2D3 value, 101 may select the A2D4 value, 110 may select the A2D5 value, and 111 may select the A2D6 value.

Similarly, comparison threshold register sets 302 and 303 may also contain individual registers 302a, 302b, 302c, etc. and 303a, 303b, 303c, etc. These individual registers may be eight bit registers containing data to be compared against actual analog values. Registers 302a, 302b, 302c, etc. contain high threshold compare data. Registers 303a, 303b, 303c, etc. contain low threshold compare data. For example, if registers 302a and 303a were configured to compare the first analog signal, seen in FIG. 3 as VCC, then both registers 302a and 303a would contain comparison data corresponding to VCC. Accordingly, the different registers in the register sets are correlated. For example, register sets 301a, 302a and 303a may each be related to a VCC comparison. The additional registers in register sets 302 and 303 would contain comparison data corresponding to other analog signals as initialized by the microcode.

Register sets 301, 302, and 303 receive a clock signal 329, which may be the system clock produced by timer 202 of control module 200. On receiving a clock high, the register sets 301, 302 and 303 send their data to corresponding selection multiplexers 304, 305, and 306. Selection multiplexers 304, 305, and 306 each pass forward the appropriate one register value. For a proper comparison to occur, it is necessary that multiplexers 304, 305, and 306 send data from parallel registers at the same time. For example, if data from register 301a is selected by multiplexer 304, then data from registers 302a and 303a must also be selected by multiplexers 305 and 306 respectively. To ensure this occurs, a counter 328, which may be any type of available counter, is used.

Counter 328 receives a three bit select register signal from register 314. The three bit select register signal is also sent to register 322 for other high speed comparator use as will be explained. The three bit select register signal generates an index in counter 328 that corresponds to the desired registers. For example, if register sets 301, 302, and 303 were each six deep, then the registers 301a, 302a, and 303a would correspond to a binary 000, registers 301b, 302b, and 303b would correspond to a binary 001 and so on. This index is sent to selection multiplexers 304, 305, and 306 each clock cycle and indicates which register data is required. This may be implemented in many ways. In one embodiment, counter 328 increments each register one after the other. For example, in a six deep register set, counter 328 would increment as follows: 301a, 302a, and 303a in one clock cycle, 301b, 302b, and 303b in the next clock cycle, and so on until 301f, 302f, and 303f. In another embodiment, it may be possible to set the index to select registers randomly such as 301a, 302a, 303a in one clock cycle and 301c, 302c, 303c in the next clock cycle. Multiplexers 304, 305, and 306 then send the selected signal to multiplexers 307, 308, and 309 respectively.

Referring to FIG. 3, a programmable frequency clock 330, which may correspond to programmable frequency clock 209 in FIG. 2, is shown. Programmable frequency clock 330 receives microcode from a system processor such as processors 203A and 203B. The microcode directs programmable frequency clock 330 to generate an output clock signal 330A at a desired frequency based on the silicon speed of digital to analog converters ("DAC") 316 and 317. The clock signal 330A should have a speed that does not trigger registers 312 and 313 to send additional data to the DACs before the DACs have completed a prior digital to analog conversion. However, clock signal 330A should also be fast enough to ensure that the DACs are not waiting too long for new data after having completed a prior digital to analog conversion. In this way, high speed comparator 300 may run at an optimum speed.

Programmable frequency clock 330 sends clock signal 330A to register 331. Register 331 then provides clock signal 330A to other components of comparator 300. For example, multiplexers 307, 308, and 309 are triggered by the rising edge of clock signal 330A, causing the multiplexers to send the selected data to intermediate registers 311, 312, and 313 respectively. Multiplexer 310 is also triggered by the rising edge of clock signal 330A. Multiplexers 332, 333, and 334 are triggered by the falling edge of clock signal 330A. The rising and falling edges of clock signal 330A are controlled by AND gates 335 and a one bit select signal from register 331.

Clock signal 329 triggers register sets 301, 302, and 303 to send their data to multiplexers 304, 305 and 306 in a first clock cycle. Clock signal 330A triggers intermediate registers 311, 312, and 313 to transmit their data to the inputs of analog section 300A in a second clock cycle. In this way, the analog select data and the operational parameter comparison data can travel from microcode initialized register sets 301, 302, and 303 to analog section 300A in two clock cycles, thus ensuring high speed comparison.

High Speed comparator analog section 300A consists of a parameter multiplexer 315, DACs 316 and 317, comparators 318 and 319, and registers 320 and 321. Parameter multiplexer 315 receives various analog signals generally corresponding to operational parameters. For example, in an optical transceiver environment, the operational parameters may be, for example, optical receive power, VCC, or the like. Parameter multiplexer 315 may be configured to receive as many analog signals as desired. Parameter multiplexer 315 also receives a three bit analog select signal from register 311. This select signal indicates which analog input signal should be compared. Referring to FIG. 3, if VCC was selected, then the select signal would be a binary 000. In a similar manner, any of the other analog signals could be selected. The selected signal is then sent to an input terminal of both comparators 318 and 319. This is advantageous as digital selection of the analog signal to be compared makes it possible to use one pair of comparators for all analog signals.

Digital to analog converters 316 and 317 both receive inputs from high speed comparator digital section 300B. DAC 316 receives the high threshold comparison data from register 312, converts it from a digital to an analog signal, and sends it to an input of high speed comparator 318. In a similar manner, DAC 317 receives the low threshold comparison data from register 313, converts it from a digital to an analog signal, and sends it to an input of high speed comparator 319. In this way, the high and low comparison data for a particular analog signal are always available for use by comparators 318 and 319 at the same time.

Comparators 318 and 319 may be identical comparators. In this description and in the claims, comparator is defined to include a window comparator or single comparator. Both comparators 318 and 319 receive an analog input signal from multiplexer 315 and a signal from DAC 316 or DAC 317 as previously described. Comparator 318 is used to complete the high threshold comparison and comparator 319 is used to complete the low threshold comparison. After the comparison is complete, comparator 318 outputs its result to register 320 and comparator 319 outputs its result to register 321.

For example, it may be desirable to compare the actual temperature of the system with a predetermined temperature range. Digital section 300B would be microcode-initiated to select temperature as the required analog signal and send the appropriate data to multiplexer 315 and DACs 316 and 317 in the manner previously discussed. Multiplexer 315 would select temperature and send that signal to an input of comparators 318 and 319. DAC 316 would send the high threshold temperature data to an input of comparator 318 and DAC 317 would send the low threshold temperature data to an input of comparator 319. Comparators 318 and 319 would then compare the actual temperature with the predetermined temperature range and record an output accordingly.

For example, if the predetermined temperature range was between 75° C. and 80° C., then 80° C. would be the threshold value for comparator 318 and 75° C. would be the threshold value for comparator 319. If the measured temperature was 85° C., both high speed comparators 318 and 319 would record a binary high as being above their thresholds and this would be stored as a binary one in registers 320 and 321. If, on the other hand, the actual temperature was 70° C., then both comparators 318 and 319 would record a binary low as being below their threshold and this would be stored as a binary zero in registers 320 and 321. Alternatively, if the actual temperature was 78° C., then comparator 318 would record a binary zero since the measured temperature is below its threshold temperature. Additionally, in this case, comparator 319 would record a binary one since the measured temperature is above its threshold temperature. A binary zero and one would be stored in registers 320 and 321, respectively. In this way, all three possible comparison results are recordable. Although temperature was used as an example, it is also possible to use comparators 318 and 319 to measure any other analog signal in a like manner.

As previously mentioned, the compared data is stored in registers 320 and 321. When both registers 320 and 321 receive a clock signal 330A from the output of register 331, the data in register 320 is sent to demultiplexer 323 and the data in register 321 is sent to demultiplexer 324. Data from register 322 is also sent to demultiplexer 323 and demultiplexer 324. This data contains an index of which individual register level of register sets 301, 302, and 303 correspond with the compared data. For example, if the compared data corresponded to registers 301a, 302a, and 303a, then a binary 000 would be sent from register 322 as this indicates the first level of registers. Demultiplexer 323 and demultiplexer 324 then forward the most recent comparison value to corresponding retrieval registers 325 and 326. Retrieval register 325 stores the high threshold comparison results from register 320. Similarly, retrieval register 326 stores the low threshold data from register 321.

The data in these retrieval registers is capable of being analyzed by other parts of the optical transceiver system. For example, queries of the compared values may be performed to ensure that operating parameters are within safe operating limits. If a parameter, optical power for example, exceeds a safe level, then an interrupt may be sent from a microprocessor and the optical transceiver system could be shut down or rebooted.

Accordingly, the principles of the present invention provide for a comparator circuit that performs high speed comparisons (even in the context of multiplexed comparison) by using microcode-initiation. Microcode-initiation provides many advantages over existing high speed comparators. For example, operational parameter comparison data and analog signal selection data are pre-selected by microcode and sent to sets of available registers. This enables the high speed comparator to execute multiple comparisons without the use of a separate microprocessor in real-time. It also allows for the analog select data and operational parameter comparison data to go from the initialized registers to the analog compare hardware in two clock cycles. This in turn allows for very high speed comparisons. Finally, because the analog select digital signal determines which analog signal at the input of a multiplexer is selected for comparison, it is possible to compare multiple analog signals using only one pair of comparators. Accordingly, the principles of the present invention represent a significant advancement in the art of high speed comparators.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A microcode-initiated high speed comparator comprising the following:

a comparator with a plurality of input nodes and at least one output node;

a parameter multiplexer with a plurality of input nodes and a selection input node, and an output node that is coupled to a first input node of the comparator;

a plurality of parameter multiplexer selection registers that are configurable to contain microcode-initialized values that are selectively coupled to the selection node of the parameter multiplexer so as to select an appropriate parameter multiplexer input node for application onto the parameter multiplexer output node, the plurality of parameter multiplexer selection registers including a selection input node for selecting one of the plurality of parameter multiplexer selection registers at a time for driving the selection node of the multiplexer;

a plurality of comparison threshold registers that are configurable to contain microcode-initialized values that are selectively coupled to a second input node of the comparator so as to provide comparison threshold data to the comparator, the plurality of comparison threshold registers also including the selection input node which also selects at least one of the plurality of comparison threshold registers at a time for providing to a second input node of the comparator;

at least one output retrieval register coupled to the output node of the comparator so as to hold a result of the comparison by the comparator during operation for later retrieval; and a digital to analog converter having an input node and an output node interposed between the plurality of comparison threshold registers and the comparator, wherein the plurality of comparison threshold registers are selectively coupled to the input node of the analog to digital converter and the output node of the digital to analog converter is coupled to the second input node of the comparator, the digital to analog converter for converting digital threshold data into analog data for use by the comparator.

2. A microcode-initiated high speed comparator in accordance with claim 1 further comprising:
a clock signal coupled to the selection input node of the plurality of parameter multiplexer selection registers and the plurality of comparison threshold registers, wherein the clock signal triggers the selection of one of the plurality of parameter multiplexer registers and one of the plurality of comparison threshold registers.

3. A microcode-initiated high speed comparator in accordance with claim 1 further comprising:
a first selection multiplexer having as plurality of input nodes coupled to the plurality of parameter multiplexer selection registers and an output node coupled to the selection input node of the parameter multiplexer, the first selection register passing an appropriate one microcode-initialized value to the selection input node of the parameter multiplexer; and
a second selection multiplexer having as plurality of input nodes coupled to the plurality of comparison threshold registers and an output node coupled to the second input node of the comparator, the second selection register passing an appropriate one microcode-initialized threshold comparison value to the second input node of the comparator.

4. A microcode-initiated high speed comparator in accordance with claim 3 further comprising:
a counter coupled to a selection node of the first selection multiplexer and the second selection multiplexer;
the counter providing an indexing signal to the selection node of the first selection multiplexer that indicates which one microcode-initialized value the first selection multiplexer will pass to the selection input node of the parameter multiplexer; and
the counter providing an indexing signal to the selection node of the second selection multiplexer that indicates which one microcode-initialized comparison value the second selection multiplexer will pass to the second input node of the comparator.

5. A microcode-initiated high speed comparator in accordance with claim 1 further comprising:
a first intermediate register coupled between the plurality of parameter multiplexer selection registers and the selection input node of the parameter multiplexer;
a second intermediate register coupled between the plurality of comparison threshold registers and the second input node of the comparator;
wherein the first intermediate register temporarily stores the microcode-initialized selection values and the second intermediate register temporarily stores the microcode-initialized comparison threshold values.

6. A microcode-initiated high speed comparator in accordance with claim 5 further comprising:
a programmable frequency clock coupled to the first and second intermediate registers,
wherein the programmable frequency clock produces a clock signal that triggers the first intermediate register to send a stored microcode-initialized value to the selection input node of the parameter multiplexer and the second intermediate register to send a stored microcode-initialized comparison value to the input node of the digital to analog converter, the speed of the clock signal being determined by the rate of the digital to analog conversion.

7. A microcode-initiated high speed comparator comprising the following:
a first comparator with a plurality of input nodes and at least one output node;
a second comparator with a plurality of input nodes and at least one output node,
a parameter multiplexer with a plurality of input nodes and a selection input node, and an output node that is coupled to a first input node of the first comparator and to a first input node of the second comparator;
a plurality of parameter multiplexer selection registers that are configurable to contain microcode-initialized values that are selectively coupled to the selection node of the parameter multiplexer so as to select an appropriate parameter multiplexer input node for application onto the parameter multiplexer output node, the plurality of parameter multiplexer selection registers including a selection input node for selecting one of the plurality of parameter multiplexer selection registers at a time for driving the selection node of the multiplexer;
a first plurality of comparison threshold registers that are configurable to contain microcode-initialized values that are selectively coupled to a second input node of the first comparator so as to provide first comparison threshold data to the first comparator, the first plurality of comparison threshold registers also including the selection input node which also selects at least one of the first plurality of comparison threshold registers at a time for providing to a second input node of the first comparator;
a second plurality of comparison threshold registers that are configurable to contain microcode-initialized values that are selectively coupled to a second input node of the second comparator so as to provide second comparison threshold data to the second comparator, the plurality of comparison threshold registers also including the selection input node which also selects at least one of the second plurality of comparison threshold registers at a time for providing to a second input node of the second comparator;
at least one output retrieval register coupled to the output node of the first comparator so as to hold a result of the comparison by the first comparator during operation for later retrieval; and
at least one output retrieval register coupled to the output node of the second comparator so as to hold a result of the comparison by the second comparator during operation for later retrieval.

8. A microcode-initiated high speed comparator in accordance with claim 7 further comprising:
a clock signal coupled to the selection input node of the plurality of parameter multiplexer selection registers, the first plurality of comparison threshold registers, and the second plurality of comparison threshold registers, wherein the clock signal triggers the selection of one of the plurality of parameter multiplexer registers, one of the first plurality of comparison threshold registers, and . one of the second plurality of comparison threshold registers.

9. A microcode-initiated high speed comparator in accordance with claim 7 further comprising:
a first selection multiplexer having as plurality of input nodes coupled to the plurality of parameter multiplexer selection registers and an output node coupled to the selection input node of the parameter multiplexer, the first selection register passing an appropriate one microcode-initialized value to the selection input node of the parameter multiplexer;

a second selection multiplexer having as plurality of input nodes coupled to the first plurality of comparison threshold registers and an output node coupled to the second input node of the first comparator, the second selection register passing an appropriate one microcode-initialized threshold comparison value to the second input node of the first comparator; and a third selection multiplexer having as plurality of input nodes coupled to the second plurality of comparison threshold registers and an output node coupled to the second input node of the second comparator, the third selection register passing an appropriate one microcode-initialized threshold comparison value to the second input node of the second comparator.

10. A microcode-initiated high speed comparator in accordance with claim 7 further comprising:

a counter coupled to a selection node of the first selection multiplexer, second selection multiplexer, and third selection multiplexer;

the counter providing an indexing signal to the selection node of the first selection multiplexer that indicates which one microcode-initialized value the first selection multiplexer will pass to the selection input node of the parameter multiplexer;

the counter providing an indexing signal to the selection node of the second selection multiplexer that indicates which one microcode-initialized comparison value the second selection multiplexer will pass to the second input node of the first comparator; and the counter providing an indexing signal to the selection node of the third selection multiplexer that indicates which one microcode-initialized comparison value the third selection multiplexer will pass to the second input node of the second comparator.

11. A microcode-initiated high speed comparator in accordance with claim 7 further comprising:

a first digital to analog converter having an input node and an output node interposed between the first plurality of comparison threshold registers and the first comparator, a second digital to analog converter having an input node and an output node interposed between the second plurality of comparison threshold registers and the second comparator, wherein the first plurality of comparison threshold registers are selectively coupled to the input node of the first analog to digital converter and the output node of the first digital to analog converter is coupled to the second input node of the first comparator and the second plurality of comparison threshold registers are selectively coupled to the input node of the second analog to digital converter and the output node of the second digital to analog converter is coupled to the second input node of the second comparator, the digital to analog converters for converting digital threshold data into analog data for use by the first and second comparators.

12. A microcode-initiated high speed comparator in accordance with claim 11 further comprising:

a first intermediate register coupled between the plurality of parameter multiplexer selection registers and the selection input node of the parameter multiplexer;

a second intermediate register coupled between the first plurality of comparison threshold registers and the second input node of the first comparator;

a third intermediate register coupled between the second plurality of comparison threshold registers and the second input node of the second comparator;

wherein the first intermediate register temporarily stores the microcode-initialized selection values, the second intermediate register temporarily stores the microcode-initialized first comparison threshold values, and the third intermediate register stores the microcode-initialized second comparison threshold values.

13. A microcode-initiated high speed comparator in accordance with claim 12 further comprising:

a programmable frequency clock coupled to the first, second, and third intermediate registers, wherein the programmable frequency clock produces a clock signal that triggers the first intermediate register to send a stored microcode-initialized value to the selection input node of the parameter multiplexer, causes the second intermediate register to send a stored microcode-initialized first comparison value to the input node of the first digital to analog converter, and causes the third intermediate register to send a stored microcode-initialized second comparison value to the input node of the second digital to analog converter, the speed of the clock signal being determined by the rate of the digital to analog conversion.

14. A microcode-initiated high speed comparator in accordance with claim 7 wherein the first comparison threshold data is high-threshold comparison data and the second comparison threshold data is low-threshold comparison data.

15. A microcode-initiated high speed comparator in accordance with claim 7 wherein the first comparator compares a high-threshold comparison value with an operational parameter value and the second comparator compares a low threshold comparison value with an operational parameter value.

16. A method for high-speed comparison comprising:

an act of configuring a plurality of parameter selection registers with microcode-initialized selection values that are selectively coupled to a selection node of a parameter multiplexer;

an act of configuring a plurality of comparison threshold registers with microcode-initialized comparison values that are selectively coupled to a second input node of a comparator;

an act of selecting an appropriate parameter multiplexer input node for application onto a parameter multiplexer output node in response to the parameter multiplexer receiving the microcode-initialized selection values;

an act of the parameter output node providing the appropriate parameter input node to a first input node of the comparator;

an act of the comparator comparing the microcode-initialized comparison values with the appropriate multiplexer input node; and an act of an output node of the comparator providing the resulting comparison to a retrieval register.

17. A method in accordance with claim 16 further comprising:

an act of configuring a digital to analog converter to have an input node and an output node interposed between the plurality of comparison threshold registers and the comparator, wherein the plurality of comparison threshold registers are selectively coupled to the input node of the analog to digital converter and the output node of the digital to analog converter is coupled to the second input node of the comparator, the digital to analog converter for converting digital threshold data into analog data for use by the comparator.

18. A method in accordance with claim 17 further comprising:
- an act of configuring a first intermediate register to be coupled between the plurality of parameter multiplexer selection registers and the selection input node of the parameter multiplexer;
- an act of configuring a second intermediate register to be coupled between the plurality of comparison threshold registers and the second input node of the comparator;
- wherein the first intermediate register temporarily stores the microcode-initialized selection values and the second intermediate register temporarily stores the microcode-initialized comparison threshold values.

19. A method in accordance with claim 18 further comprising:
- an act of configuring a programmable frequency clock to be coupled to the first and second intermediate registers,
- wherein the programmable frequency clock produces a clock signal that triggers the first intermediate register to send a stored microcode-initialized value to the selection input node of the parameter multiplexer and the second intermediate register to send a stored microcode-initialized comparison value to the input node of the digital to analog converter, the speed of the clock signal being determined by the rate of the digital to analog conversion.

* * * * *

UNITED STATES PATENT AND TRADEMARK OFFICE
CERTIFICATE OF CORRECTION

PATENT NO. : 7,468,618 B2
APPLICATION NO. : 11/172295
DATED : December 23, 2008
INVENTOR(S) : Dybsetter et al.

Page 1 of 1

It is certified that error appears in the above-identified patent and that said Letters Patent is hereby corrected as shown below:

Column 5
Line 67, insert --detail-- after "further"

Column 11
Line 16, change "as" to --a--
Line 23, change "as" to --a--

Column 12
Line 60, delete "." before "one"

Column 13
Line 11, change "as" to --a--

Signed and Sealed this

Ninth Day of March, 2010

David J. Kappos
*Director of the United States Patent and Trademark Office*